United States Patent
Rofougaran et al.

(10) Patent No.: US 8,018,393 B2
(45) Date of Patent: Sep. 13, 2011

(54) METHOD AND SYSTEM FOR USING A TRANSFORMER FOR FM TRANSMIT AND FM RECEIVE FUNCTIONALLY

(75) Inventors: Ahmadreza Rofougaran, Newport Coast, CA (US); Maryam Rofougaran, Rancho Palos Verde, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/536,059

(22) Filed: Aug. 5, 2009

(65) Prior Publication Data
US 2009/0289870 A1    Nov. 26, 2009

Related U.S. Application Data

(63) Continuation of application No. 11/750,091, filed on May 17, 2007, now Pat. No. 7,586,458.

(60) Provisional application No. 60/895,698, filed on Mar. 19, 2007.

(51) Int. Cl.
*H01Q 1/44* (2006.01)

(52) U.S. Cl. ......... 343/856; 343/850

(58) Field of Classification Search ......... 343/850, 343/856; 455/200.1, 234.1, 236.1, 333, 341
See application file for complete search history.

(56) References Cited

U.S. PATENT DOCUMENTS 4,504,705 A * 3/1985 Pilloud ............ 381/77
2008/0139149 A1 * 6/2008 Mu et al. ........ 455/200.1
* cited by examiner

*Primary Examiner* — Hoang V Nguyen
(74) *Attorney, Agent, or Firm* — McAndrews, Held & Malloy, Ltd.

(57) ABSTRACT

Aspects of a method and system for using a transformer for FM transmit and FM receive functionality may include communicating data-bearing signals via primary windings of a transformer, wherein secondary windings of the transformer may be utilized for receiving and/or transmitting the communicated data-bearing signals, wherein the secondary windings may be utilized as a load for the transmitting. The secondary windings and/or a power amplifier may be biased for the transmitting by applying an electrical signal at a terminal of the secondary windings, wherein the electrical signal that may be applied at the center terminal may be a biasing voltage. The receiving and the transmitting may be operated in time division duplex mode, or simultaneously. DC signal components for the receiving may be blocked by using a plurality of capacitors.

22 Claims, 3 Drawing Sheets

METHOD AND SYSTEM FOR USING A TRANSFORMER FOR FM TRANSMIT AND FM RECEIVE FUNCTIONALLY

CROSS-REFERENCE TO RELATED APPLICATIONS/INCORPORATION BY REFERENCE

This application makes reference to, claims priority to, and claims the benefit of U.S. Provisional Application Ser. No. 60/895,698, filed on Mar. 19, 2007.

This application also makes reference to:
U.S. application Ser. No. 11/750,111, filed on even date herewith; and
U.S. application Ser. No. 11/750,103, filed on even date herewith.

Each of the above referenced applications is hereby incorporated herein by reference in its entirety.

FIELD OF THE INVENTION

Certain embodiments of the invention relate to signal processing for communication systems. More specifically, certain embodiments of the invention relate to a method and system for using a transformer for FM transmit and FM receive functionality.

BACKGROUND OF THE INVENTION

Many communication systems require appropriate coupling of the antenna to the receiver and transmitter hardware. One reason, may be a need to match impedances between the transmitter and/or the receiver and the antenna. Impedance matching may attempt to equalize the output impedance at the antenna to the input impedance of the system that may be connected to the antenna. By matching the impedance, the power transfer from and to the antenna may be maximized and reflections due to impedance mismatch may be reduced. In some instances, matching impedances may be undesirable. For example, an antenna coupled to a high impedance load may provide better voltage transfer while the high impedance may lower the loading of the antenna. In some cases, this may be referred to as impedance bridging. In most cases, however, suitable impedance matching may be desirable and may require some type of a matching network between antenna and the receiver and/or transmitter.

In many modern radio frequency communication systems, mobile communication terminals are increasingly miniaturized and it may become increasingly important to provide matching circuitry with a reduced number of limited-size components. For implementations of matching circuits on circuit boards, it may be particularly desirable to reduce the number and/or size of the components that are utilized.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and/or system for using a transformer for FM transmit and FM receive functionality, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for using a transformer for FM transmit and FM receive functionality. Aspects of the method and system for using a transformer for FM transmit and FM receive functionality may comprise communicating radio frequency signals via an antenna coupled to primary windings of a radio frequency transformer, wherein secondary windings of the radio frequency transformer may be utilized for receiving and/or transmitting the communicated radio frequency signals. The secondary windings may be utilized as a load of a power amplifier used for the transmitting. By applying an electrical signal at a terminal of the secondary windings, the secondary windings and/or the power amplifier may be biased. Receiving and transmitting may be operated in time division duplex mode or simultaneously. The electrical signal applied at the center terminal may be a biasing voltage. By using a plurality of capacitors, DC signal components for receiving may be blocked during receiving. The antenna may be a single-ended antenna, coupled to a first terminal of the primary windings, and a second terminal of the primary windings may be coupled to ground. In another embodiment of the invention, the antenna may be a differential antenna and a first antenna terminal may be coupled to a first terminal of the primary winding and a second antenna terminal may be coupled to a second terminal of the primary winding. The communicated radio signals may be frequency modulated, Bluetooth signals and/or Wireless LAN signals.

Figure 1:
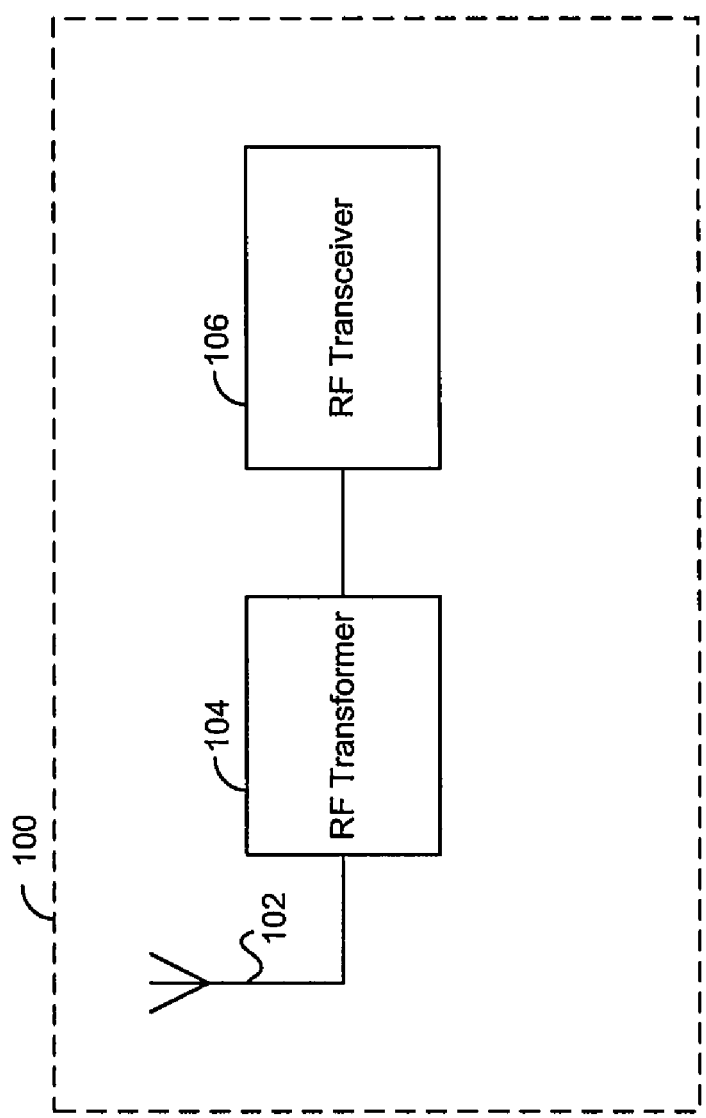
FIG. 1 is a block diagram illustrating an exemplary RF system, in accordance with an embodiment of the invention.

FIG. 1 is a block diagram illustrating an exemplary RF system, in accordance with an embodiment of the invention. Referring to FIG. 1, there is shown an RF receiver system 100 comprising an antenna 102, an RF transformer 104 and an RF transceiver 106.

A radio frequency (RF) transformer may comprise suitable logic, circuitry and/or code to enable suitable coupling of the antenna 102 to the RF transceiver 106. The RF transformer 104 may, for example, match the impedance of the antenna to the RF transceiver 106. The RF transceiver 106 may comprise suitable logic, circuitry and/or code to enable processing and generating of RF receive signals and/or RF transmit signals, respectively.

Figure 2A:
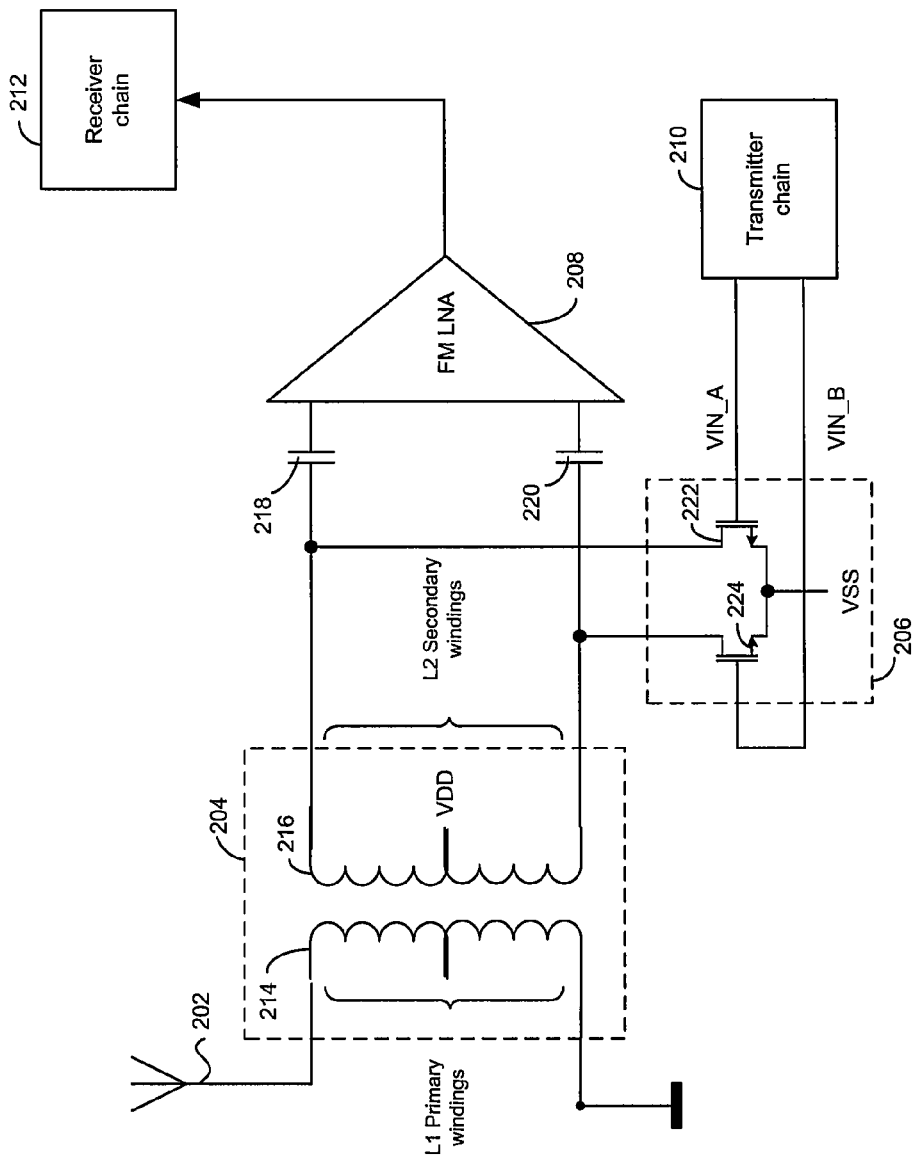
FIG. 2A is a circuit diagram illustrating an exemplary duplex transformer, in accordance with an embodiment of the invention.

FIG. 2A is a circuit diagram illustrating an exemplary duplex transformer, in accordance with an embodiment of the invention. Referring to FIG. 2A, there is shown an antenna 202, an RF transformer 204, a power amplifier 206, a low-noise amplifier 208, a transmitter chain 210, a receiver chain 212 and capacitors 218 and 220. The RF transformer 204 may comprise a primary winding 214 and a secondary winding 216. The power amplifier 206 may comprise FETs 222 and 224.

In accordance with various embodiments of the invention, an RF transformer 204 may be used as a transmit transformer and/or a receive transformer, coupling antenna 202 to the power amplifier 206 to enable transmission, and to the low-noise amplifier 208 to enable reception, respectively. When a signal is received at antenna 202, it may be fed to the primary winding 214 of the RF transformer 204. The primary winding 214 may comprise L1 windings. The primary winding 214 may transfer electrical energy received via the antenna 202 to the secondary winding 216 by magnetic coupling. The low-noise amplifier 208 may be coupled to the secondary winding 216 via the capacitors 218 and 220, and may comprise suitable logic, circuitry and/or code to enable amplification of a signal received at the secondary winding 216. The capacitors 218 and 220 may block DC voltage due to the bias voltage VDD that may be applied at a terminal of the secondary winding 216. The secondary winding 216 may comprise, for example, L2 windings. The amplified signal at the output of the low-noise amplifier 208 may be fed to the receiver chain 212, which may comprise suitable logic, circuitry and/or code to enable processing of the received radio frequency signal.

For transmission, the transmitter chain 210 may comprise suitable logic, circuitry and/or code to enable generation of differential RF transmit signals. The generated RF transmit signals from the transmitter chain 210 may be coupled to the inputs VIN_A and VIN_B of the power amplifier 206. For an RF transmit signal, it may be desirable to transmit at higher power levels than the power levels of a receive signal. Hence, the RF transmit signal may be amplified in the power amplifier 206, which may comprise suitable logic, circuitry and/or code to enable power amplification of the signal at its input. The differential output of the power amplifier 206 may be coupled to the secondary winding 216. Hence, the secondary winding 216 of the RF transformer 204 may be an output load of the power amplifier 206. Also, the voltage VDD applied at the secondary winding 216 may provide suitable biasing to the power amplifier 206. The secondary winding 216 may transfer electrical energy received via power amplifier 206 to the primary winding 214 by magnetic coupling, from where the radio frequency signal may be fed to the antenna 202. In one embodiment of the invention, the power amplifier 206 may comprise FETs, as illustrated in FIG. 2. The invention may, however, not be limited to a particular embodiment of the power amplifier 206. Accordingly, in other exemplary embodiments of the invention, the antenna 202 may be a differential antenna, for example a loop antenna or a coil antenna.

In some instances, reception and transmission may occur in a time division duplex (TDD) mode. In this case, only transmission or reception may occur at any given instance in time. In another embodiment of the invention, transmission and reception may take place simultaneously. It may generally be desirable that the transmit frequency be different from the receive frequency in case of simultaneous operation, to reduce interference problems, for example.

Figure 3:
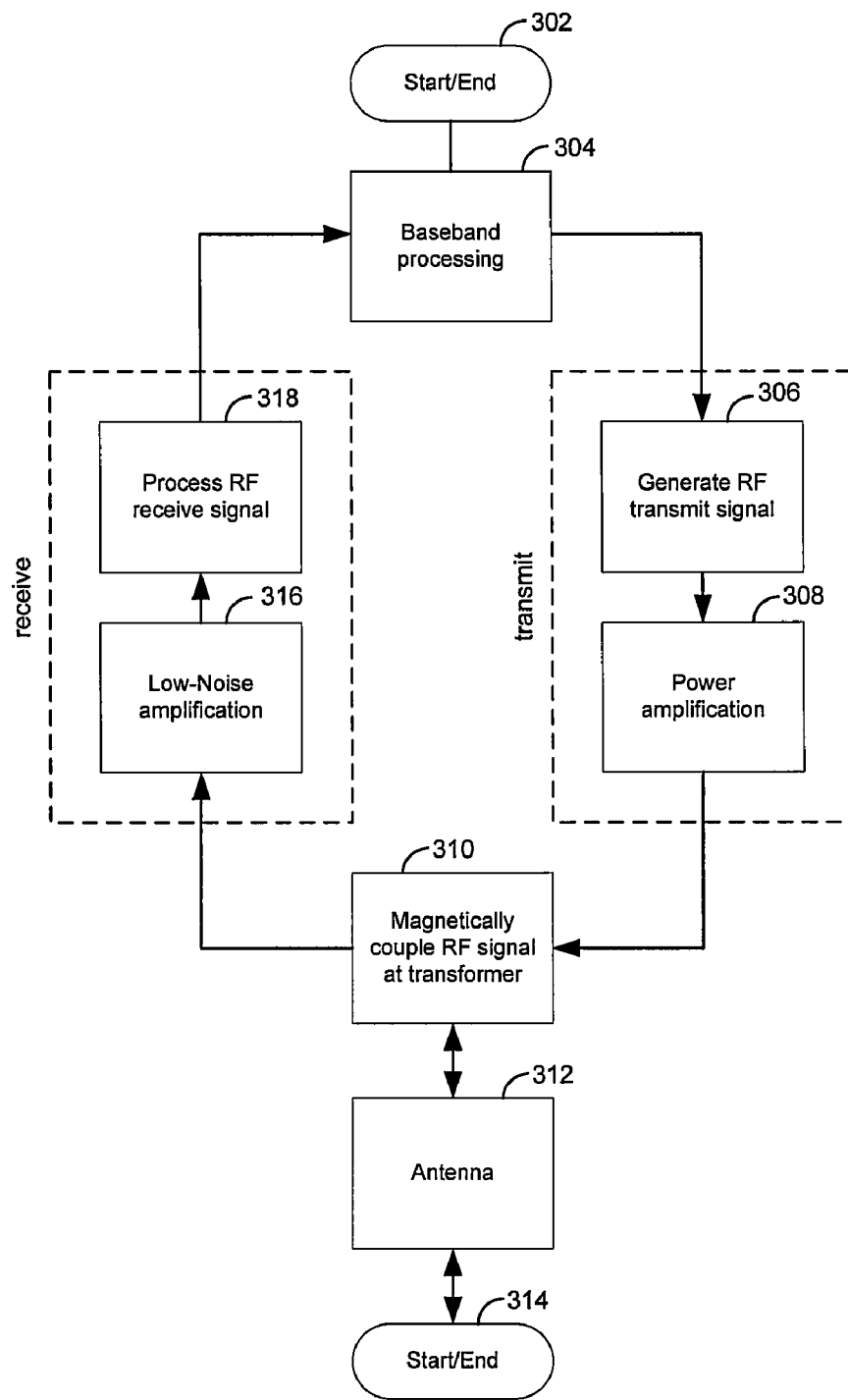
FIG. 3 is a flow chart illustrating simultaneous receiver and transmitter operation, in accordance with an embodiment of the invention.

FIG. 3 is a flow chart illustrating simultaneous receiver and transmitter operation, in accordance with an embodiment of the invention. In one embodiment of the invention, RF signal reception may be simultaneous with RF signal transmission. In another embodiment of the invention, RF signal reception and RF signal transmission may be separated in time, as described above. In the case of RF signal transmission, a baseband signal may be generated in step 304. From the baseband signal generated in step 304, an RF transmit signal may be generated in step 306. The RF transmit signal may be amplified in step 308 before it may be magnetically coupled in step 310. Generally, magnetic coupling of the RF signal in step 310 may occur at a RF transformer. In step 312, the RF transmit signal may be transmitted from an antenna.

In the case of reception, the RF receive signal may be received by an antenna in step 312. The RF receive signal may be magnetically coupled to a receive signal chain in a transformer in step 310. The RF receive signal may be amplified by, for example, a low-noise amplifier in step 316. In step 318, the RF signal may be processed. For example, in step 318, the signal may be demodulated and converted to baseband. In step 304, the baseband receive signal may be appropriately processed further.

In accordance with an embodiment of the invention, a method and system for using a transformer for FM transmit and FM receive functionality may comprise communicating radio frequency signals via an antenna 202 coupled to primary windings 214 of a radio frequency transformer 204, wherein secondary windings 216 of the radio frequency transformer 204 may be utilized for receiving and/or transmitting the communicated radio frequency signals. The secondary windings 216 may be utilized as a load of a power amplifier 206 used for transmitting. By applying an electrical signal, for example VDD, at a terminal of the secondary windings 216, the secondary windings 216 and/or the power amplifier 206 may be biased.

Receiving and transmitting may be operated in time division duplex mode or simultaneously. The electrical signal applied at the center terminal may be a biasing voltage VDD. By using a plurality of capacitors, for example capacitors 218 and 220, DC signal components for receiving may be blocked. The antenna 202 may be a single-ended antenna, coupled to a first terminal of the primary windings 214, and a second terminal of the primary windings 214 may be coupled to ground. In another embodiment of the invention, the antenna 202 may be a differential antenna and a first antenna terminal may be coupled to a first terminal of the primary winding 214 and a second antenna terminal may be coupled to a second terminal of the primary winding 214. The communicated radio signals may be frequency modulated, Bluetooth signals and/or Wireless LAN signals.

Another embodiment of the invention may provide a machine-readable storage, having stored thereon, a computer program having at least one code section executable by a machine, thereby causing the machine to perform the steps as described above for using a transformer for FM transmit and FM receive functionality.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a)

conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing communication signals, the method comprising:
communicating data-bearing signals via primary windings of a transformer, wherein secondary windings of said transformer are utilized for receiving and/or transmitting said communicated data-bearing signals, and said secondary windings are utilized as a load for said transmitting.

2. The method according to claim 1, comprising biasing said secondary windings and/or a power amplifier for said transmitting by applying an electrical signal at a terminal of said secondary windings.

3. The method according to claim 2, wherein said electrical signal applied at said center terminal may be a biasing voltage.

4. The method according to claim 1, comprising operating said receiving and said transmitting in time division duplex mode.

5. The method according to claim 1, comprising operating said receiving and said transmitting simultaneously.

6. The method according to claim 1, comprising blocking DC signal components for said receiving by using a plurality of capacitors.

7. The method according to claim 1, wherein an antenna coupled to said primary windings is a single-ended antenna, coupled to a first terminal of said primary windings, and a second terminal of said primary windings is coupled to ground.

8. The method according to claim 1, wherein an antenna coupled to said primary windings is a differential antenna and a first differential antenna terminal is coupled to a first terminal of said primary winding and a second differential antenna terminal is coupled to a second terminal of said primary winding.

9. The method according to claim 1, wherein said communicated data-bearing signals are frequency modulated.

10. The method according to claim 1, wherein said communicated data-bearing signals are Bluetooth signals.

11. The method according to claim 1, wherein said communicated data-bearing signals are Wireless LAN signals.

12. A system for processing communication signals, the system comprising:
one or more circuits that are operable to:
communicate data-bearing signals via primary windings of a transformer, wherein secondary windings of said transformer are utilized for receiving and/or transmitting said communicated data-bearing signals, and said secondary windings are utilized as a load for said transmitting.

13. The system according to claim 12, wherein said one or more circuits bias said secondary windings and/or a power amplifier for said transmitting by applying an electrical signal at a terminal of said secondary windings.

14. The system according to claim 13, wherein said electrical signal applied at said center terminal may be a biasing voltage.

15. The system according to claim 12, wherein said one or more circuits operate said receiving and said transmitting in time division duplex mode.

16. The system according to claim 12, wherein said one or more circuits operate said receiving and said transmitting simultaneously.

17. The system according to claim 12, wherein said one or more circuits block DC signal components for said receiving by using a plurality of capacitors.

18. The system according to claim 12, wherein an antenna coupled to said primary windings is a single-ended antenna, coupled to a first terminal of said primary windings, and a second terminal of said primary windings is coupled to ground.

19. The system according to claim 12, wherein an antenna coupled to said primary windings is a differential antenna and a first differential antenna terminal is coupled to a first terminal of said primary winding and a second differential antenna terminal is coupled to a second terminal of said primary winding.

20. The system according to claim 12, wherein said communicated data-bearing signals are frequency modulated.

21. The system according to claim 12, wherein said communicated data-bearing signals are Bluetooth signals.

22. The system according to claim 12, wherein said communicated data-bearing signals are Wireless LAN signals.

* * * * *